(12) United States Patent
Negishi

(10) Patent No.: US 6,455,768 B2
(45) Date of Patent: Sep. 24, 2002

(54) WATERPROOF CONSTRUCTION OF COMMUNICATION EQUIPMENT

(75) Inventor: Masayuki Negishi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/853,699

(22) Filed: May 14, 2001

(30) Foreign Application Priority Data

May 15, 2000 (JP) ........................................ 2000-142134

(51) Int. Cl.⁷ ................................................. H05K 5/02
(52) U.S. Cl. .................. 174/17 CT; 174/50; 174/17 R; 174/135; 220/38
(58) Field of Search .............................. 174/17 CT, 50, 174/50.5, 52.3, 17 R, 22 R, 48, 17 LF, 17 VA, 152 R, 142, 17.06, 135; 220/3.8, 4.12; 16/2.1, 2.2; 313/318.07

(56) References Cited

U.S. PATENT DOCUMENTS

| | | | | |
|---|---|---|---|---|
| 2,590,803 A | * | 3/1952 | Unger et al. ............. | 174/17 CT |
| 3,230,290 A | * | 1/1966 | Nelson et al. ............... | 156/228 |
| 3,825,148 A | * | 7/1974 | Hunter et al. ............ | 174/17 LF |
| 3,829,546 A | * | 8/1974 | Hunter et al. ............ | 174/152 R |
| 3,895,735 A | * | 7/1975 | Clay ............................ | 220/315 |
| 3,974,933 A | * | 8/1976 | Toth et al. ...................... | 174/50 |
| 4,492,817 A | * | 1/1985 | Selby ...................... | 174/152 R |
| 5,382,752 A | * | 1/1995 | Reyhan et al. ................. | 174/38 |
| 5,560,511 A | * | 10/1996 | McNerney ................... | 220/327 |
| 5,864,091 A | * | 1/1999 | Sumida ........................ | 174/50 |
| 5,880,401 A | * | 3/1999 | Leischner et al. ....... | 174/17 CT |
| 6,294,724 B1 | * | 9/2001 | Sasaoka et al. .............. | 136/244 |

* cited by examiner

Primary Examiner—Dean A. Reichard
Assistant Examiner—Angel R. Estrada
(74) Attorney, Agent, or Firm—Foley & Lardner

(57) ABSTRACT

Waterproof construction of communication equipment improved so as to prevent water from leaking in through the section of waterproof packing to electronic parts and electronic circuits is provided. The waterproof construction of communication equipment includes waterproof packing at an opening of a body of the communication equipment, situated between a lid or a door and the equipment body, for sealing the joint of them, and a water absorber having greater elastic contractibility than that of the waterproof packing, the water absorber placed further inside of the equipment body than the waterproof packing. The waterproof packing and the water absorber are held between the lid or the door and the equipment body.

16 Claims, 6 Drawing Sheets

WATERPROOF CONSTRUCTION OF COMMUNICATION EQUIPMENT

BACKGROUND OF THE INVENTION

1. Field of the Invention

The present invention relates to waterproof construction of communication equipment which is settled outdoors, in particular, to waterproof construction in which a waterproof packing is provided at an opening of a body of the communication equipment, between a lid or a door which blocks the opening and the equipment body, for sealing joints of them.

2. Description of the Related Art

Conventionally, a body of radio communication equipment settled outdoors such as a movable body communication base station is provided with waterproof construction (here, all the construction of waterproof, drip-proof and splash-proof is called waterproof construction in general) at its opening in order to protect electronic parts and electronic circuits on a printed board mounted inside against submergence. Namely, in the waterproof construction of the communication equipment, a groove 23 is provided to one side (or both sides) of joints of an equipment body 21 and a cover (a lid or a door) 22, and an elastic waterproof packing 24 is fit into the groove 23 as shown in FIG. 1. On the occasion of combining the equipment body 21 and the cover 22, the waterproof packing 24 is screwed up by a screw 25 etc. and deformed by the pressure so that the waterproof packing 24 sticks fast to the joint with the elasticity, for perfectly sealing a joint gap between the equipment body 21 and the cover 22. Thus the waterproof packing 24 prevents water from leaking in by its contact pressure.

In such construction that a waterproof packing is held between an equipment body and a cover, the equipment body and the cover need to be screwed up tightly in order that the waterproof packing is pressurized and deformed to have enough contact pressure for preventing water leakage.

However, since compressing the waterproof packing 24 is a necessary factor of the waterproof construction, when, for example, the screw 25 is loose, there is a foreign substance stuck in the joints between the equipment body 21 and the cover 22, or the waterproof packing 24 is partly off the groove 23, the waterproof packing 24 may not bring its intended resilience into full play, and therefore, may not keep prescribed necessary contact pressure.

In this situation, a crevice is generated between the equipment body 21 and the cover 22 as shown in FIG. 2, letting water leak inside the body, and consequently, causing trouble that damages electronic parts and electronic circuits mounted inside. In addition, as shown in FIG. 3, according to the construction where the string-type waterproof packing 24 is set along a periphery of an opening of the equipment body 21, there is a risk of leakage from a joint 27.

Therefore, reliable waterproof construction, which is worked out for protecting the electronic parts and electronic circuits on the printed board mounted inside of the body against submergence even when the water packing does not work efficiently due to an unexpected accident and a crevice is generated between the equipment body and the cover, is desired.

SUMMARY OF THE INVENTION

It is therefore an object of the present invention to provide waterproof construction of communication equipment improved to prevent even a little water from leaking in to electronic parts and electronic circuits through the part of a waterproof packing.

In accordance with the present invention, there is provided waterproof construction of communication equipment comprising a waterproof packing at an opening of a body of the communication equipment, between a lid or a door which blocks the opening and the equipment body, for sealing the joint of them, and a water absorber having greater elastic contractibility than that of the waterproof packing, placed on more inside of the equipment body than a position of the waterproof packing, held between the lid or the door and the equipment body.

In this case, it is preferred that the waterproof packing and the water absorber are disposed on facing surfaces of the lid or the door and the equipment body linearly at predetermined intervals so as to surround the opening, and on the occasion of blocking the opening, the water absorber is held between the facing surfaces of the lid or the door and the equipment body before the waterproof packing is held between them. Also it is preferred that the waterproof packing is held in a state of performing required elastic deformation in the process of elastic deformation due to a blockade of the lid or the door and the equipment body.

According to another aspect of the present invention, it is effective that grooves for regulating the position of the waterproof packing and the water absorber are set at least to the lid or the door, or the equipment body on the joints, and that the water absorber is constituted of material having greater elastic contractibility than that of the waterproof packing.

Furthermore, according to another aspect of the present invention, it is preferable that sectional area of the groove is set corresponding to that of the water absorber so that when the elastic deformation of the water absorber takes place in the groove according to the blockade of the lid or the door and the equipment body, the water absorber fills the groove, and swells out to a crevice between the both. Also it is preferable that the water absorber includes a waterproofing film for preventing water from leaking inside of the equipment body in a blocked condition, and the water absorber is previously fitted to a supporting frame in a prescribed shape and held between the lid or the door and the equipment body with the frame, and particularly, the supporting frame is provided to the groove formed on the lid or the door, or the equipment body on the side opposite to the groove housing the water absorber.

BRIEF DESCRIPTION OF THE DRAWINGS

The above and further objects and the novel feature of the invention will more fully appear from the following detailed description when the same is read in connection with the accompanying drawings, in which.

DESCRIPTION OF THE PREFERRED EMBODIMENTS

Figure 1:
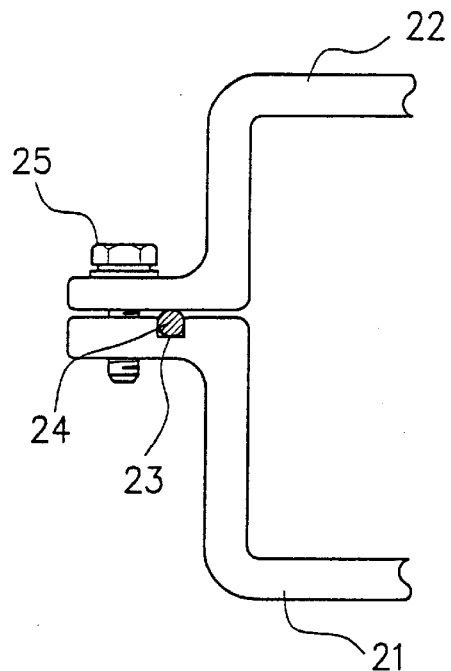
FIG. 1 is a vertical sectional view showing a main part of a conventional example.
Figure 2:
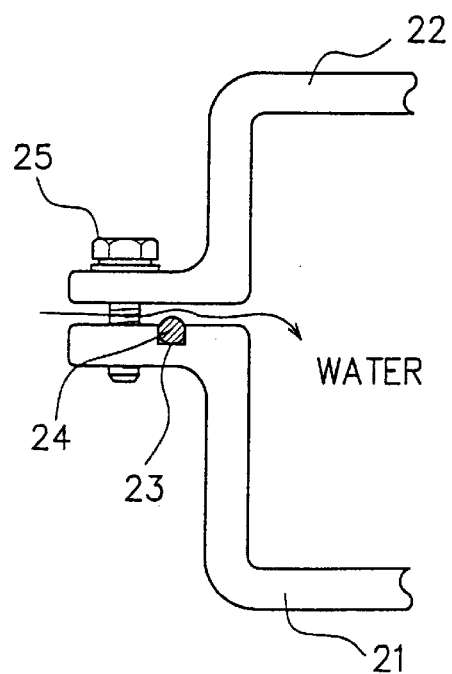
FIG. 2 is a vertical sectional view showing a main part of a conventional example in a condition of a failure in waterproofing.
Figure 3:
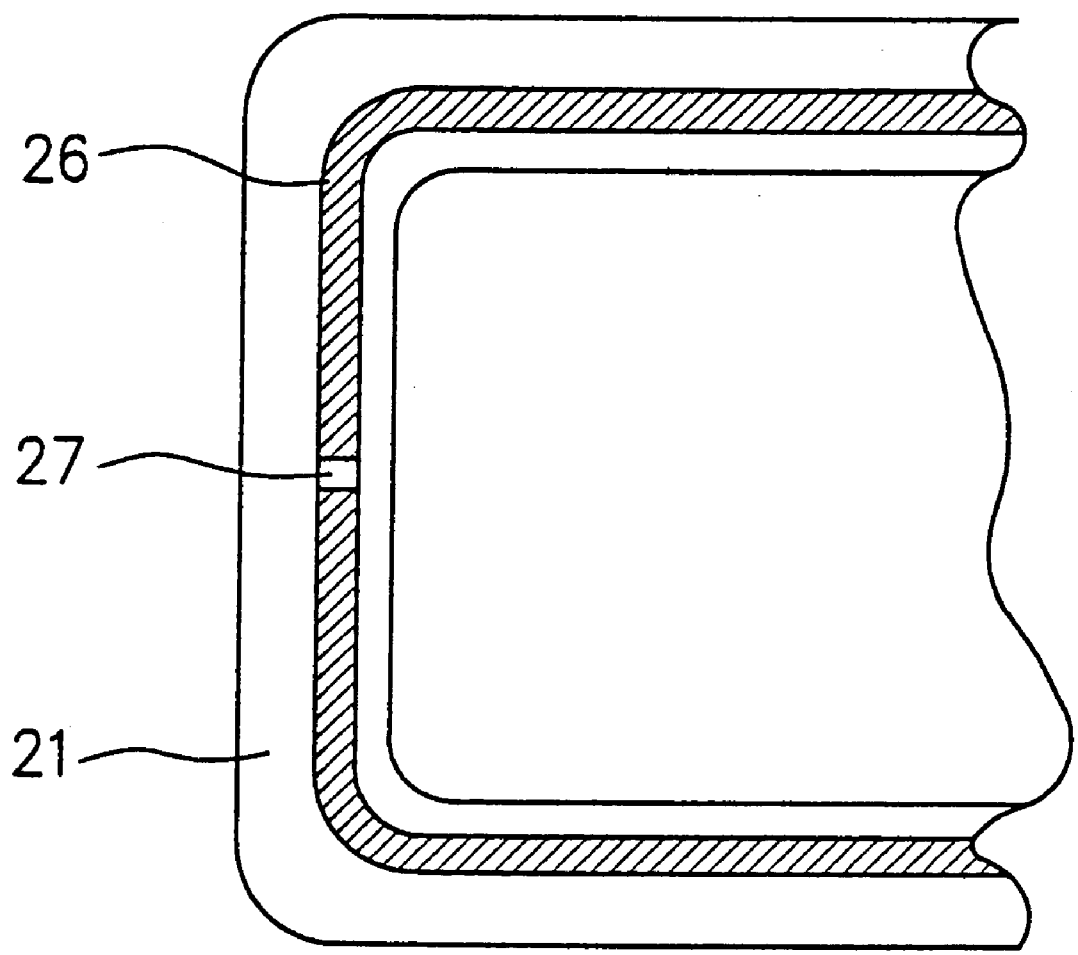
FIG. 3 is a plane view showing a main part of a conventional example.
Figure 4:
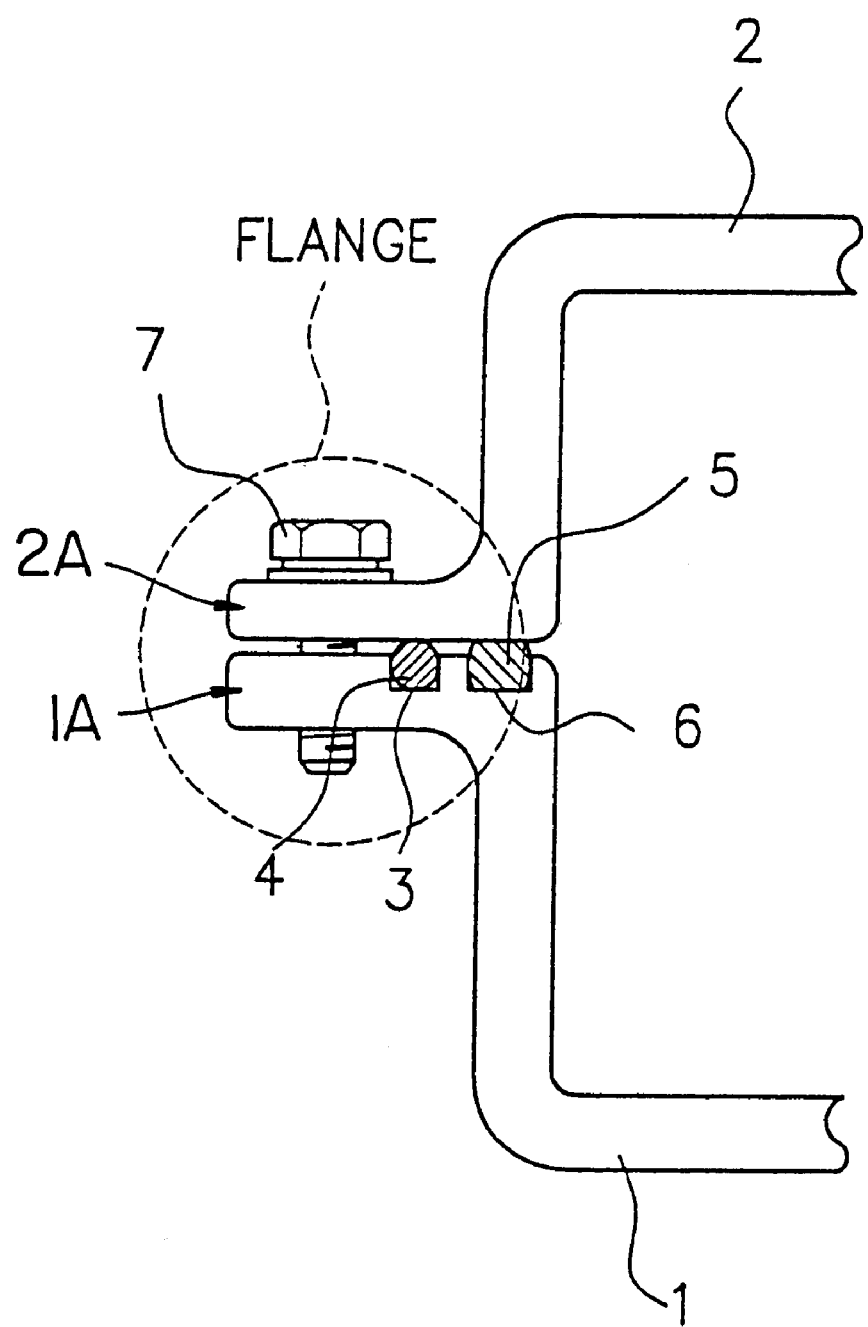
FIG. 4 is a vertical sectional view showing a main part of a first embodiment of the present invention.
Figure 6:
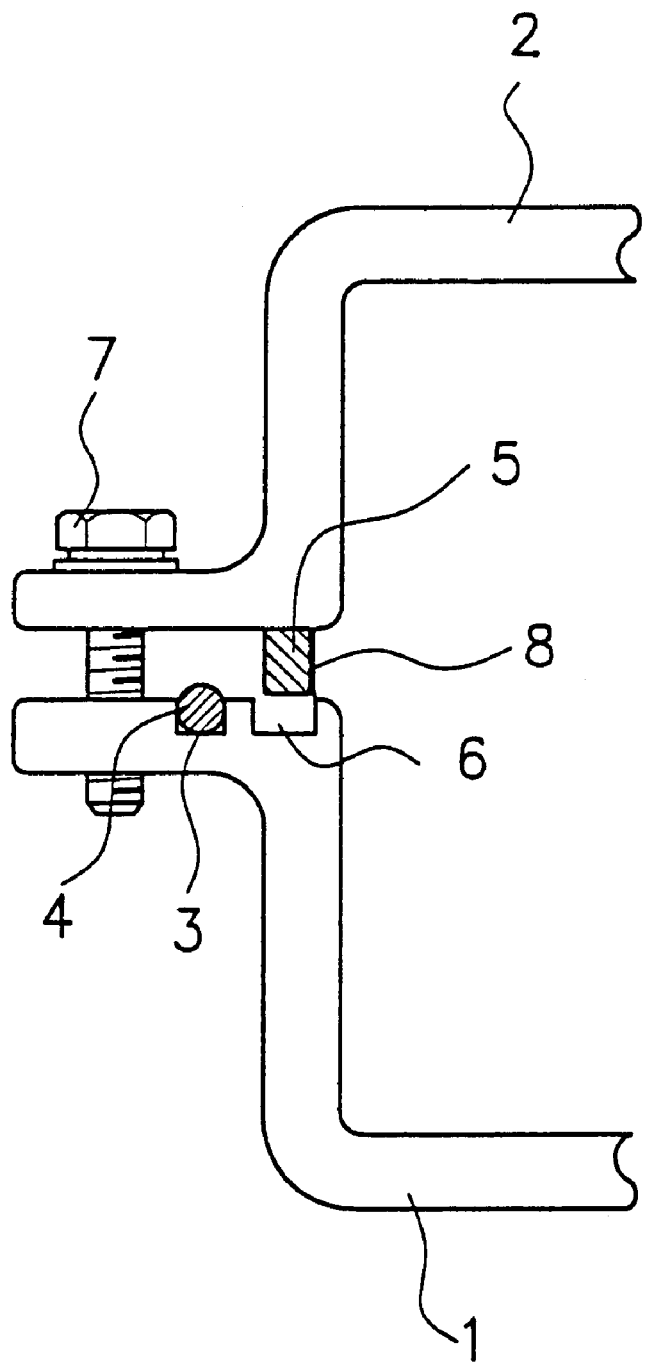
FIG. 6 is a vertical sectional view showing a main part of a second embodiment of the present invention.
Figure 7:
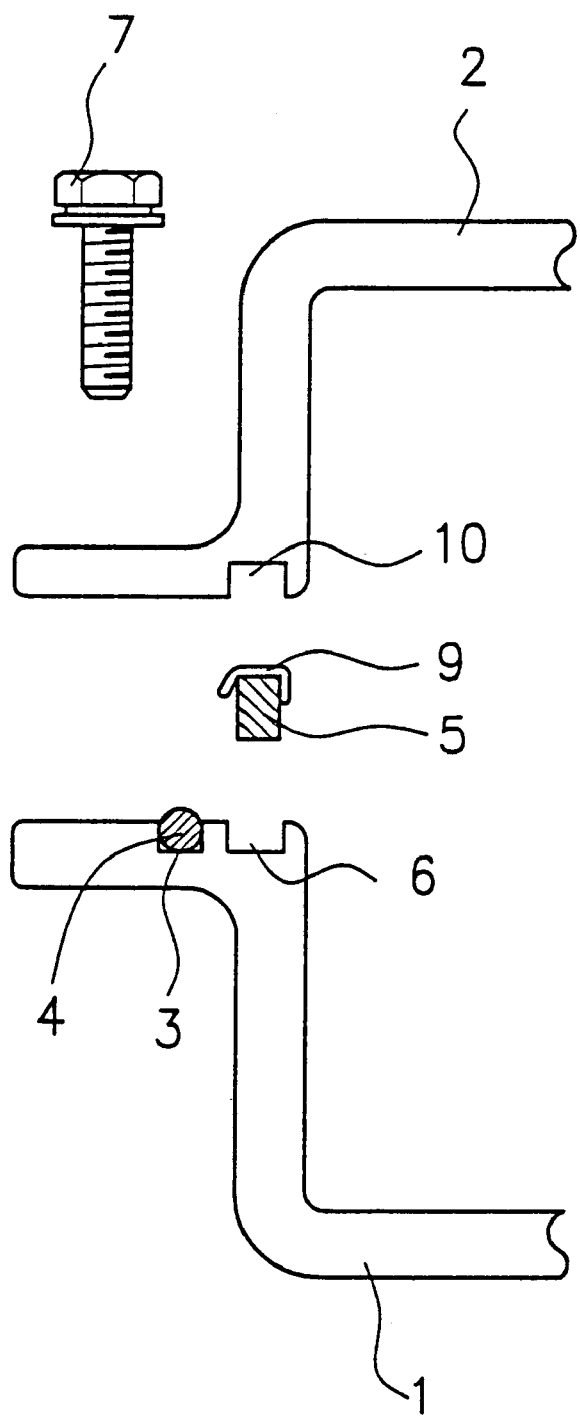
FIG. 7 is a vertical sectional view showing a main part of a third embodiment of the present invention.

Referring now to the drawings, a description of preferred embodiments of the present invention will be given in detail. Incidentally, FIG. 4 is a vertical sectional view showing a main part of a first embodiment of the present invention, FIG. 5 is a vertical sectional view of the main part for explaining the embodiment, FIG. 6 is a vertical sectional view showing a main part of a second embodiment of the present invention, and FIG. 7 is a vertical sectional view showing a main part of a third embodiment.

The common part(s) to the construction of all the embodiments is/are as follows. That is, a string-type waterproof packing 4 is provided at an opening of a communication equipment body 1, between a cover (a lid or a door) 2 which blocks the opening and the equipment body 1 for sealing joints of them.

Besides, a string-type water absorber 5 composed of material having greater elastic contractibility than that of the waterproof packing 4, placed on more inside of the equipment body 1 than a position of the waterproof packing 4, held between a flange 2A of the cover 2 and a flange 1A of the equipment body 1.

In the first embodiment of the present invention, grooves 3 and 6 for regulating the position of the waterproof packing 4 and the water absorber 5 are formed in line on facing surfaces between the flange 2A of the cover 2 and the flange 1A of the equipment body 1 at predetermined intervals so as to surround the periphery of the opening, and the waterproof packing 4 and the water absorber 5 are fit into the grooves.

Besides, the waterproof packing 4 is set to a size (of sectional form) adequate for its portion projecting out of the groove 3 onto the joint of the equipment body 1 to be necessary amount for producing enough contact pressure to perform the waterproof function by the elastic deformation when screwed up by the screw 7. Besides, as an example of the material for the water absorber 5, there are a porous bag, a mesh cloth bag filled with an absorptive polymer, urethane foam itself and so forth.

Figure 5A:
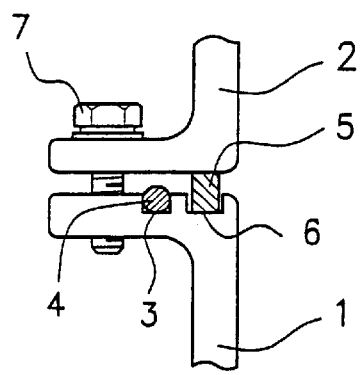
FIG. 5A to 5C are vertical sectional views showing an order of constructing the waterproof construction of the present invention.
Figure 5B:
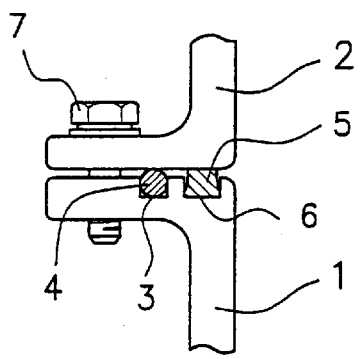
Figure 5C:
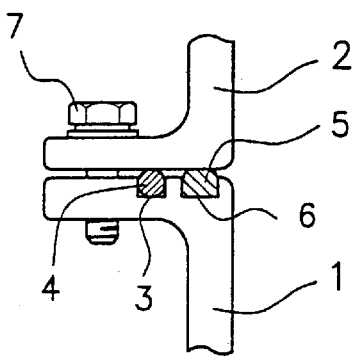

In addition, as shown in FIG. 5A to 5C, on the occasion of blocking the opening, the water absorber 5 is held between the facing surfaces of the flange 2A of the cover 2 and the flange 1A of the equipment body 1 before the waterproof packing 4 is held between them (refer to FIG. 5A). In the process of blockade of the cover 2 and the equipment body 1 being screwed up by the screw 7, the elastic deformation of the water absorber 5 occurs in the groove 6 (refer to FIG. 5B), and then the elastic deformation of the waterproof packing 4 occurs. As the waterproof packing 4 is being held between the facing surfaces of the flange 2A of the cover 2 and the flange 1A of the equipment body 1, the water absorber 5 performs required elastic deformation (to fill the groove 6, and swell out to a crevice between the facing surfaces) and is held (refer to FIG. 5C).

Incidentally, in this embodiment as shown in FIG. 4, the grooves 3 and 6 which regulate the position of the waterproof packing 4 and the water absorber 5 are formed on the flange 1A of the equipment body 1. They can be formed on the flange of the cover 2 for convenience in the design, and of course they can be formed on the both flanges also. The sectional area of the groove 6 is designed corresponding to that of the water absorber 5 so that the water absorber can swell therein.

In the second embodiment, as shown in FIG. 6, the water absorber 5 includes a waterproofing film 8 for preventing water from leaking inside of the equipment body in a blocked condition. Moreover, the water absorber 5 is previously fitted to the flange 2A of the cover 2 at the prescribed position opposite to the groove 6 on the side of the equipment body 1. Other construction or function is the same as that of the first embodiment and not described here.

In the third embodiment, as shown in FIG. 7, the water absorber 5 is previously fitted to a supporting frame 9, which is made of metal or resin in a prescribed shape, in order to maintain the shape at first fitting. With the frame, the water absorber 5 is held between the flange 2A of the cover 2 and the flange 1A of the equipment body 1. Particularly, in this embodiment, the supporting frame 9 is set to the groove 10 formed on the flange 2A of the cover 2 on the side opposite to the groove 6 housing the water absorber 5 (when the groove 6 is provided to the cover, the supporting frame 9 is set to the flange 1A on the side of the equipment body 1). Besides, the supporting frame 9 can be put on and taken off the cover 2 easily, and thereby improved in the maintenance and replacement by means of loading the supporting frame 9 with spring or resilience and fit it into the groove 10 on the side of the cover 2. Other construction or function is the same as that of the first embodiment and not described here.

As is clear by these embodiments, generally, by screwing up we the equipment body 1 and the cover 2 with a screw 7, the waterproof packing 4 is deformed by the pressure, and with the elasticity, the waterproof packing 4 perfectly seals a joint (flange) gap between the equipment body 1 and the cover 2, and thus prevents water from leaking in by its contact pressure.

However, in such construction that a waterproof packing 4 is held between an equipment body 1 and a cover 2, when it is impossible to secure enough contact pressure, that is, when the screw 7 is loose, or there is a foreign substance stuck between the joints of the equipment body 1 and the cover 2, etc., the waterproof packing 4 may not produce its intended effect on waterproofing, and therefore, let a little water leak inside the body from the gap between the equipment body 1 and the cover 2.

In this situation, according to the constitution of the present invention, it is made possible to prevent water from leaking in to electronic parts and electronic circuits of the equipment by the water absorber which is set on the inside of the waterproof packing 4 on the equipment body and absorbs rain water. Moreover, water can be stopped by the function of the waterproofing film 8.

In accordance with the present invention, when even a little water leak inside the equipment due to insufficient waterproof function because the equipment body and the lid or the door (the cover) are screwed up insufficiently and enough contact pressure cannot be obtained, there is a crevice at a contact part of the waterproof packing, or the waterproof packing itself is set wrongly, the water absorber absorbs the water, and thereby it is made possible to protect the electronic parts and electronic circuits on the printed board mounted inside of the equipment body against submergence. Thus more reliable waterproof construction for communication equipment can be realized.

While the preferred embodiment of the present invention has been described using specific terms, such description is for illustrative purposes only, and it is to be understood that changes and variations may be made without departing from the spirit or the scope of the following claims.

What is claimed is:

1. Waterproof construction of communication equipment, comprising:

a waterproof packing at an opening of a body of the communication equipment, the waterproof packing disposed between a lid or a door which blocks the opening and the equipment body, for sealing a joint therebetween; and a water absorber placed further toward the inside of the equipment body than the waterproof packing and disposed between the lid or the door and the equipment body.

2. The waterproof construction of communication equipment as claimed in claim 1, wherein the water absorber is constituted of material having greater elastic contractibility than that of the waterproof packing.

3. Waterproof construction of communication equipment, comprising:

a waterproof packing at an opening of a body of the communication equipment, the waterproof packing disposed between a lid or a door which blocks the opening and the equipment body, for sealing a joint therebetween; and a water absorber placed further toward the inside of the equipment body than the waterproof packing between the lid or the door and the equipment body; wherein the waterproof packing and the water absorber are disposed linearly at predetermined intervals so as to surround the opening, and on the occasion of blocking the opening, the water absorber is held between facing surfaces of the equipment body and the lid or the door before the waterproof packing is held between them.

4. The waterproof construction of communication equipment as claimed in claim 3, wherein the water absorber is constituted of material having greater elastic contractibility than that of the waterproof packing.

5. Waterproof construction of communication equipment, comprising:

a waterproof packing at an opening of a body of the communication equipment, the waterproof packing disposed between a lid or a door which blocks the opening and the equipment body, for sealing a joint therebetween;

a water absorber placed further toward the inside of the equipment body than the waterproof packing between the lid or the door and the equipment body; and grooves for regulating the position of the waterproof packing and the water absorber, formed at least on the lid or the door, or the equipment body.

6. The waterproof construction of communication equipment as claimed in claim 5, wherein the water absorber is constituted of material having greater elastic contractibility than that of the waterproof packing.

7. The waterproof construction of communication equipment as claimed in claim 6, wherein a cross-sectional area of the groove is configured so that when elastic deformation of the water absorber occurs in the groove by a closing of the lid or the door on the equipment body, the water absorber at least fills the groove.

8. The waterproof construction of communication equipment as claimed in claim 6, wherein the water absorber includes a waterproofing film for preventing water from leaking inside of the equipment body in a blocked condition.

9. The waterproof construction of communication equipment as claimed in claim 6, wherein the water absorber is fitted to a supporting frame in a prescribed shape, and the supporting frame is also held between the lid or the door and the equipment body.

10. The waterproof construction of communication equipment as claimed in claim 6, wherein the water absorber is fitted to a supporting frame in a prescribed shape and the supporting frame is also held between the lid or the door and the equipment body, and the supporting frame is in contract with a groove formed on the lid or the door, or the equipment body, opposite to a groove for housing the water absorber.

11. Waterproof construction of communication equipment, comprising:

a waterproof packing at an opening of a body of the communication equipment, the waterproof packing disposed between a lid or a door which blocks the opening and the equipment body, for sealing a joint therebetween;

a water absorber placed further toward the inside of the equipment body than the waterproof packing between the lid or the door and the equipment body; and grooves for regulating the position of the waterproof packing and the water absorber, formed at least on the lid or the door, or the equipment body; wherein the waterproof packing and the water absorber are disposed linearly at predetermined intervals so as to surround the opening, and upon closing the lid or door onto said body, the water absorber contacts the lid or door and the body before the waterproof packing.

12. The waterproof construction of communication equipment as claimed in claim 11, wherein the water absorber is constituted of material having greater elastic contractibility than that of the waterproof packing.

13. The waterproof construction of communication equipment as claimed in claim 12, wherein a cross-sectional area of the groove is configured so that when elastic deformation of the water absorber occurs in the groove by a closing of the lid or the door on the equipment body, the water absorber at least fills the groove.

14. The waterproof construction of communication equipment as claimed in claim 12, wherein the water absorber includes a waterproofing film for preventing water from leaking inside of the equipment body in a blocked condition.

15. The waterproof construction of communication equipment as claimed in claim 12, wherein the water absorber is fitted to a supporting frame in a prescribed shape, and the supporting frame is also held between the lid or the door and the equipment body.

16. The waterproof construction of communication equipment as claimed in claim 12, wherein the water absorber is fitted to a supporting frame in a prescribed shape and the supporting frame is also held between the lid or the door and the equipment body, and the supporting frame is in contact with a groove formed on the lid or the door, or the equipment body, opposite to a groove for housing the water absorber.

* * * * *